United States Patent
Noh et al.

(10) Patent No.: US 6,744,321 B2
(45) Date of Patent: Jun. 1, 2004

(54) BIAS CONTROL CIRCUIT FOR POWER AMPLIFIER

(75) Inventors: Youn Sub Noh, Daejeon (KR); Ji Hoon Kim, Daegu (KR); Chul Soon Park, Daejeon (KR); Joon Hyung Kim, Jeonju-si (KR)

(73) Assignee: Information and Communications University Educational Foundation (KR)

( * ) Notice: Subject to any disclaimer, the term of this patent is extended or adjusted under 35 U.S.C. 154(b) by 0 days.

(21) Appl. No.: 10/387,062

(22) Filed: Mar. 11, 2003

(65) Prior Publication Data

US 2003/0218506 A1 Nov. 27, 2003

(30) Foreign Application Priority Data

May 22, 2002 (KR) .................. 10-2002-0028379

(51) Int. Cl.$^7$ ................................. H03F 3/04
(52) U.S. Cl. ....................... 330/296; 330/285
(58) Field of Search ................. 330/296, 285, 330/288, 302; 323/315, 316

(56) References Cited

U.S. PATENT DOCUMENTS 6,486,739 B1 * 11/2002 Luo .......................... 330/288
6,492,875 B2 * 12/2002 Luo et al. ................... 330/296
6,549,076 B2 * 4/2003 Kuriyama ................... 330/296

* cited by examiner

Primary Examiner—Henry Choe
(74) Attorney, Agent, or Firm—Anderson Kill & Olick, PC

(57) ABSTRACT

A bias control circuit for a power amplifier including an RF amplifier having a transistor for power amplification, comprises two components. A first component is a bias circuit having an active bias transistor operating in an active mode and connected to a predetermined Vref pin to provide the transistor for power amplification with a base current and a second component is a bias current control circuit having another active bias transistor connected to a predetermined Vcon pin and turned on or off depending on a high or a low mode of the Vcon pin to thereby control a base current and a quiescent current of the transistor for power amplification.

5 Claims, 4 Drawing Sheets

BIAS CONTROL CIRCUIT FOR POWER AMPLIFIER

FIELD OF THE INVENTION

The present invention relates to a bias control circuit for a power amplifier; and, more particularly, to a bias control circuit capable of improving a power added efficiency of a power amplifier.

BACKGROUND OF THE INVENTION

In a wireless mobile communications system, a power amplifier is a key component that determines a lifetime of a battery in a mobile terminal, e.g., a conventional CDMA mobile handset. Thus, the power amplifier is required to be of a high efficiency characteristic in order to increase the lifetime of the battery. The power added efficiency of the conventional power amplifier is normally highest when an output power thereof is at its highest level, decreases as the output power falls off from the highest level of, e.g., 30 dBm. However, the power amplifier is usually operated at an output power ranging from, e.g., −15 to 15 dBm. Therefore, there have been proposed various schemes capable of improving the power added efficiency of the power amplifier at such low output power range, by way of increasing a quiescent current in a high output power mode, while decreasing the bias current in a low output power mode.

Such methods include a technique for controlling Vcc (DC supply) or VB (base bias voltage) of a bias circuit, and a dual bias control technique for controlling both Vcc and VB. All of these techniques adopt a DC-to-DC converter, which requires a DSP (digital signal processor) or an RF (radio frequency) coupler for the control thereof, specifically the RF coupler being adopted in case the control is implemented in an RF range.

The technique for controlling Vcc mentioned above is directed to reduce DC power consumption when the power amplifier is in the low output power mode. To be specific, Vcc is reduced in the low output power mode but increased in the high output power mode by using the DC-to-DC converter to thereby improve the efficiency of the power amplifier.

The technique for controlling VB mentioned above accomplishes the power added efficiency improvement by way of adopting the DC-to-DC converter to control VB. To be more specific, in the low output power mode, the DC-to-DC converter reduces the bias current and thus, decreases the DC power consumption, while, in the high output power mode, the DC-to-DC converter increases the bias current.

The dual bias control technique increases the power added efficiency of the power amplifier by simultaneously controlling both Vcc and VB in a manner described above.

All of the above-mentioned conventional techniques adopt the DC-to-DC converter to control the DC power consumption depending on the output power mode of the power amplifier. These conventional techniques, however, have a drawback in that it is very difficult to install such components as the RF coupler and the DC-to-DC converter within a highly miniaturized module of power amplifier having a size of, e.g., 6×6 mm$^2$. Thus, it may be desired to develop a method for increasing the power added efficiency of the power amplifier in the low output power mode without an additional component such as the DC-to-DC converter.

SUMMARY OF THE INVENTION

It is, therefore, an object of the present invention to provide a cost-effective miniaturized bias control circuit capable of effectively controlling DC power consumption in a high/low output power mode to thereby greatly improve a power added efficiency in the low output power mode without adversely affecting the power added efficiency in the high output power mode.

In accordance with the present invention, there is provided a bias control circuit for a power amplifier including an RF amplifier having a power transistor for power amplification, including: a bias circuit having a first active bias transistor and connected to a predetermined Vref pin to provide the power transistor with a first bias current; and a bias current control circuit having a second active bias transistor and a diode, the diode being prepared between a Vcon pin and a collector of the second active bias transistor to thereby control a second bias current of the power transistor.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Figure 1:
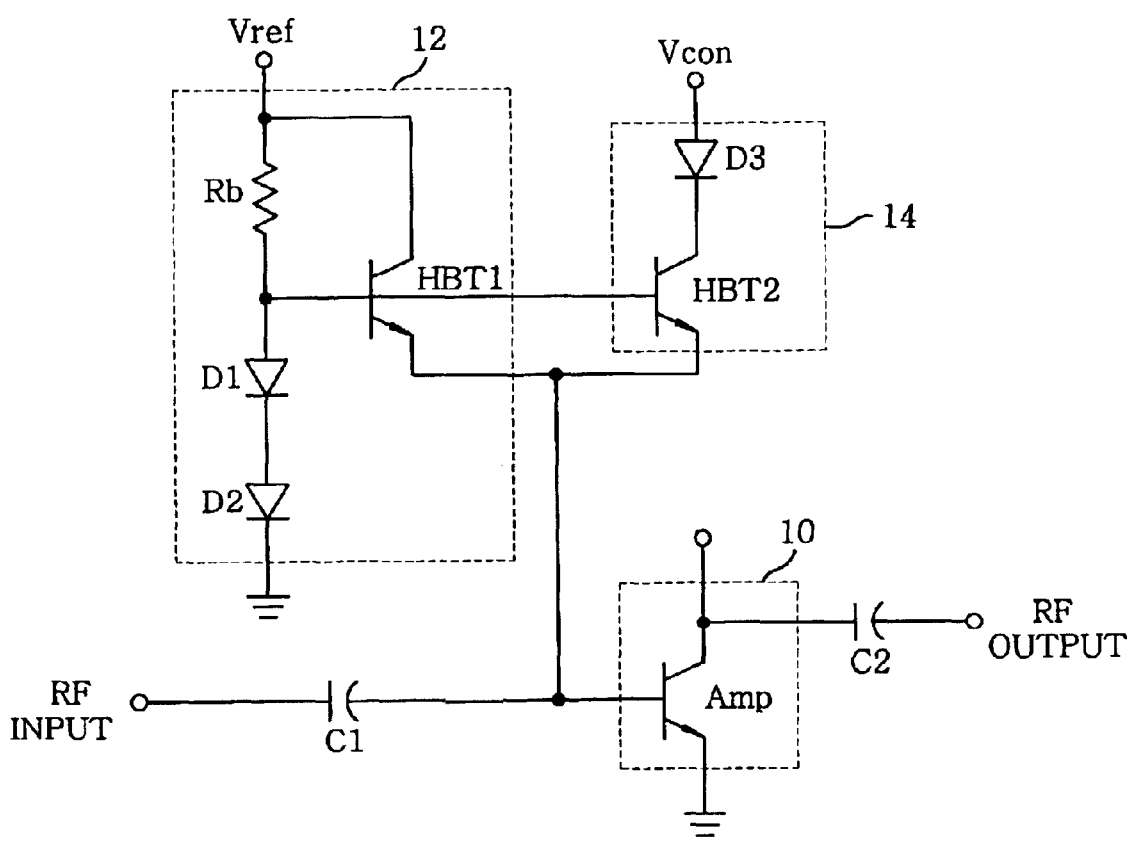
FIG. 1 describes a bias control circuit for a power amplifier in accordance with the preferred embodiment of the present invention.

Referring to FIG. 1, there is provided a bias control circuit for a power amplifier in accordance with the preferred embodiment of the present invention. A bias circuit 12 and a bias current control circuit 14 are connected to an RF input terminal of an RF amplifier 10. The RF amplifier 10 is constituted by multi-cell transistors. The bias circuit 12 includes a resistor Rb, diodes D1 and D2 and an active bias transistor HBT1. The bias current control circuit 14 includes a diode D3 and an active bias transistor HBT2.

The active bias transistors HBT1 and HBT2 serve to drive a base current of the RF amplifier 10. To be specific, the active bias transistor HBT1 is connected to a reference voltage (Vref) pin to operate in a forward-active mode, while the active bias transistor HBT2 is connected to a control voltage (Vcon) pin to be turned on or off depending on a high or low voltage mode of the Vcon pin to thereby control the base current of the RF amplifier 10. Herein, the diode D3 is inserted to prevent the active bias transistor HBT2 from operating in a saturation mode when Vcon is low, since an electric potential in a collector of the active bias transistor HBT2 is low in the low voltage mode of Vcon.

Figure 4:
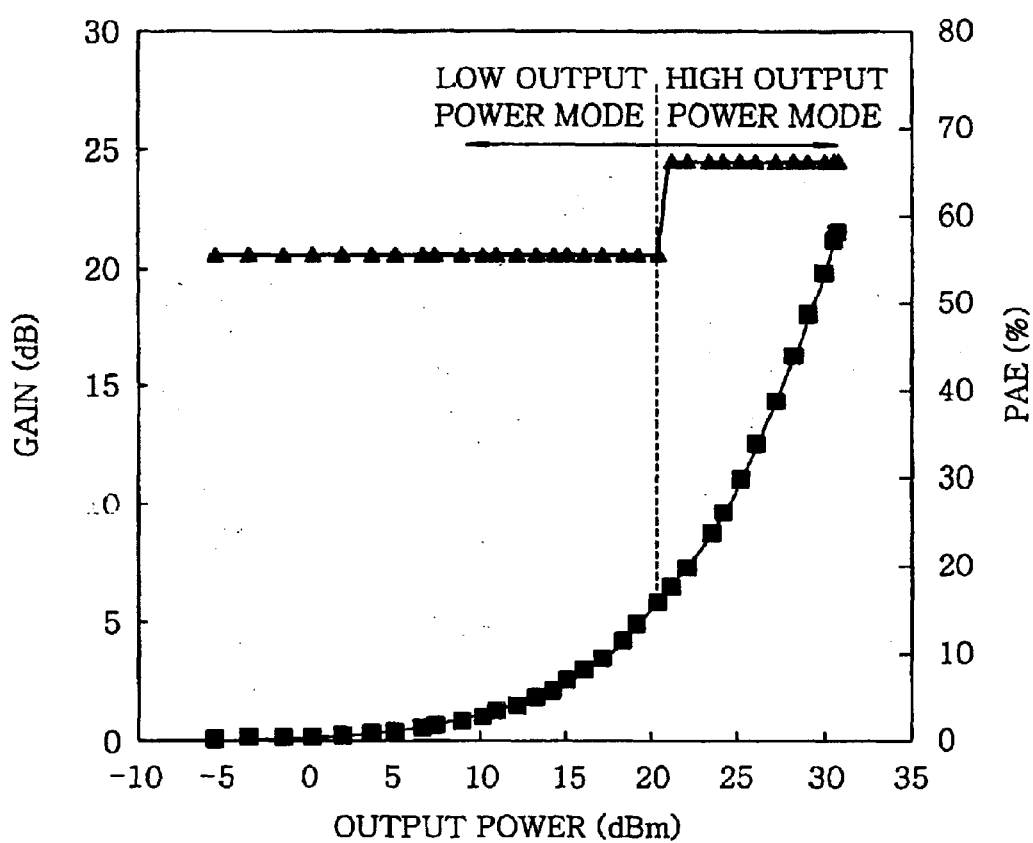
FIG. 4 depicts a plot of a gain and a PAE of the power amplifier as a function of output power, wherein the power amplifier switches from the low output power mode to the high output power mode or vice versa at an output power of 20 dBm.

The control voltage Vcon is supplied by a built-in mobile station modem (MSM) chip of a conventional CDMA mobile handset, so that no additional circuitry is required to supply the control voltage Vcon. Referring to FIG. 4 for example, Vcon is high when the output power is above 20 dBm (high output power mode), and low when the output power is not greater than 20 dBm (low output power mode).

An operating point of the RF amplifier 10 varies depending on the base current thereof. As the base current is increased, the RF amplifier 10 operates as more like a class A amplifier, so that the efficiency of the power amplifier is deteriorated while the linearity thereof is improved. To the contrary, if the base current is decreased, the RF amplifier 10 operates as more like a class B amplifier, so that the linearity of the RF amplifier 10 is deteriorated while the efficiency thereof is improved.

The active bias transistor HBT1 always operates in the active mode, regardless of the mode of Vcon, so that a constant first current (e.g., 68 mA/β, β: forward current gain) can be supplied therefrom to a base of the RF amplifier 10. On the other hand, because the collector of the active bias transistor HBT2 is connected to the Vcon pin via the diode D3, if Vcon is High ranging from, e.g., 2.8 to 3.3 V, the active bias transistor HBT2 operates in the active mode, so that a second current (e.g., 32 mA/β) can be additively supplied therefrom to the base of the RF amplifier 10.

On the other hand, if Vcon is Low ranging from, e.g., 0 to 0.5 v, the electric potential of the collector of the active bias transistor HBT2 becomes higher than that of Vcon due to the presence of the diode D3 so that the active bias transistor HBT2 fails to supply the second current to the base of the RF amplifier 10. Accordingly, if Vcon is Low (e.g., 0 to 0.5 V), the RF amplifier 10 is operated only by the first current provided from the active bias transistor HBT1, so that the RF amplifier 10 functions as near the class B amplifier featuring an enhanced power added efficiency.

If the diode D3 were removed from its position between the collector of the active bias transistor HBT2 and the Vcon pin, the electric potential of the collector of the active bias transistor HBT2 might be reduced in the low voltage mode of Vcon, which in turn might cause the active bias transistor HBT2 to operate in the saturation mode and the base current to be greatly increased. Accordingly, a voltage drop in the resistor Rb would become increased, resulting in a reduction of a base voltage of the active bias transistor HBT1 and, thus, ending up with a malfunctioning of the whole bias circuit.

Figure 2:
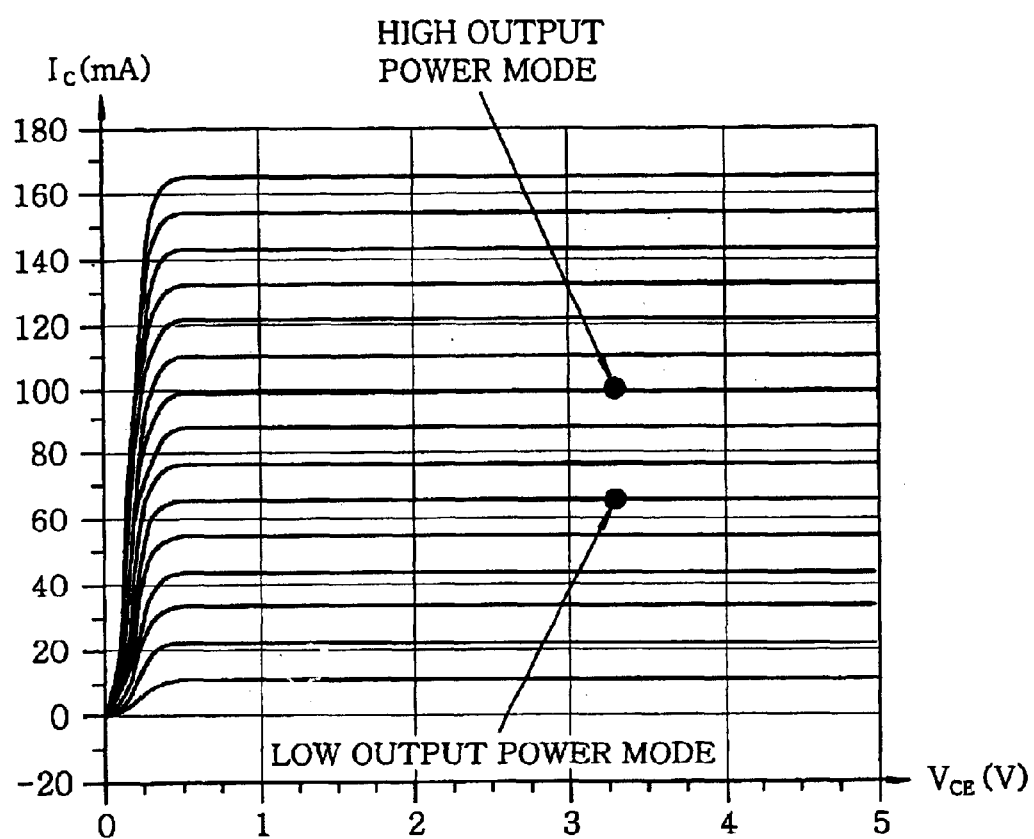
FIG. 2 provides a plot of a quiescent current in a low/high output power mode of a two-stage power amplifier.

By considering the operational principle described so far, there is illustrated, in FIG. 2, a plot defining operating points of a "Cascade 2-stage power amplifier" in two different voltage modes of Vcon. Each of the operating points can be adjusted depending on the number of active bias transistors connected in parallel.

Figure 3:
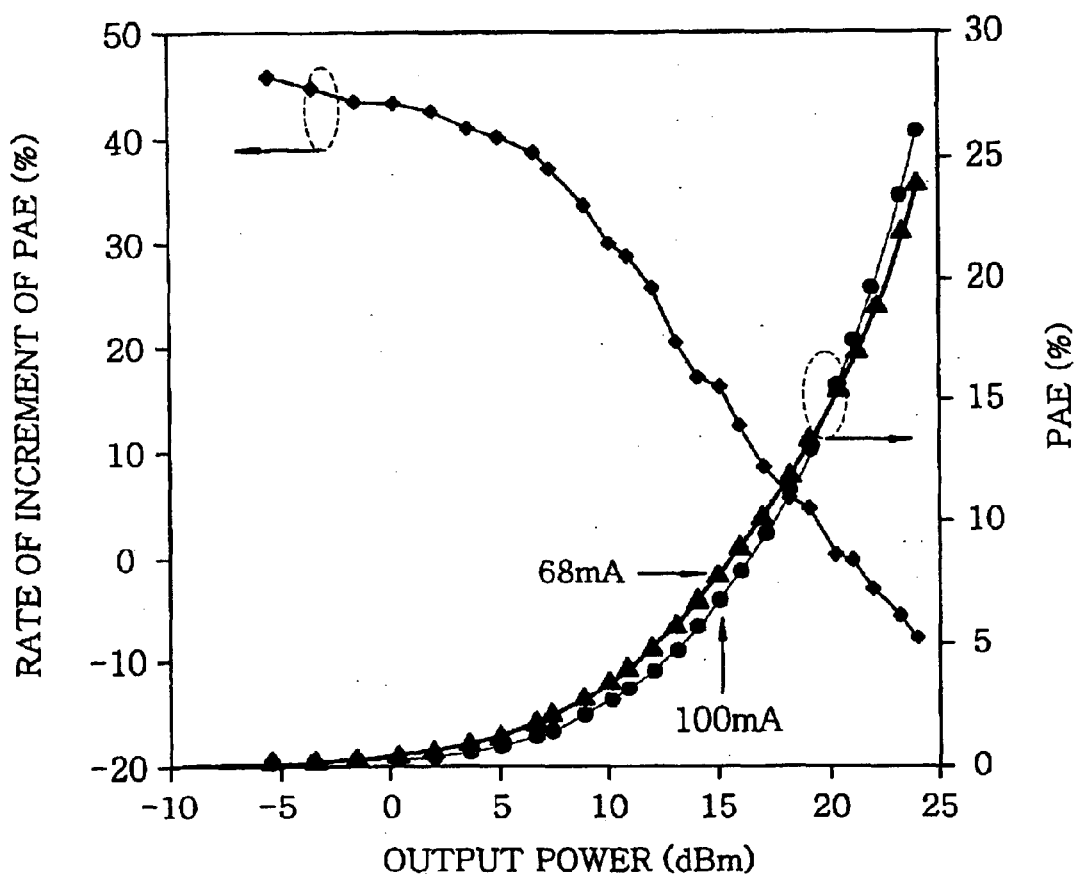
FIG. 3 offers a plot showing a PAE (power added efficiency) and rate of increment of the PAE of the power amplifier as a function of output power in the low/high output power modes.

FIG. 3 offers a plot of PAEs versus output power respectively measured when the quiescent current is set at, e.g., 68 mA and 100 mA, and a plot of a rate of increment of PAE versus output power measured when the quiescent current is set at, e.g., 68 mA and 100 mA, with the output power range being from −5 dBm to 25 dBm. As an output power is increased from the value of, e.g., −5 dBm, the rate of increment of the PAE is decreased from the value of 47%. The increment rate of the PAE comes to have a negative value when the output power is larger than, e.g., 20 dBm. Therefore, the power amplifier should be operated in the high output power mode by setting Vcon a High when the output power is greater than, e.g., 20 dBm. When the output power ranging from, e.g., −15 dBm to 15 dBm, which is the most widely accepted as the output power level, is considered, the rate of increment of the PAE is measured to be 16.1% at the output power of, e.g., 15 dBm and to be 30% or larger at the output power of, e.g., 10 dBm or less. The circuit in accordance with the present invention can be implemented within the MMIC (Monolithic Microwave Integrated Circuits) by dividing one original active bias transistor. Herein, total sum of each area of a plurality of divided active bias transistors is set up to be approximately equal to that of the original active bias transistor. Therefore, the circuit in accordance with the present invention can be implemented without increase of total area of the active bias transistors. Since only the diode D3 is newly added, an additional space required for the diode D3 is negligible and no additional DC power is needed to control the high and low output power mode.

Referring to FIG. 4, there is provided a plot illustrating a gain and a PAE of the RF amplifier as a function of output power, wherein the RF amplifier switches from the low output power mode to the high output power mode or vice versa at an output power of 20 dBm. In the high output power mode, the quiescent current of the two-stage RF amplifier 10 is set at, e.g., 100 mA, which is widely used as a bias current of a typical RF amplifier having no bias control circuit. In the low output power mode, the bias current is set at, e.g., 68 mA. A reference output power of the switching is set at, e.g., 20 dBm. The gain is found to be 20.5 dB at the quiescent current of, e.g., 68 mA and 24.5 dB at the quiescent current of, e.g., 100 mA.

While the invention has been shown and described with respect to the preferred embodiments, it will be understood by those skilled in the art that various modifications may be made without departing from the sprit and scope of the invention as defined in the following claims.

What is claimed is:

1. A bias control circuit for a power amplifier including an RF amplifier having a power transistor for power amplification, comprising:

a bias circuit having a first active bias transistor and connected to a predetermined Vref pin to provide the power transistor with a first bias current; and a bias current control circuit having a second active bias transistor and a diode, the diode being prepared between a Vcon pin and a collector of the second active bias transistor to thereby control a second bias current of the power transistor.

2. The circuit of claim 1, wherein respective emitters of the first and the second active bias transistors are commonly connected to a base of the power transistor.

3. The circuit of claim 2, wherein the second active bias transistor provides the second bias current of a first value when Vcon is high, and provides the second bias current of a second value when Vcon is low, the first value being larger than the second value, to thereby reduce the second bias current in case Vcon is low and increase the second bias current in case Vcon is high.

4. The circuit of claim 3, wherein, in case Vcon is low, the second active bias transistor is turned off, and the second value is zero.

5. The circuit of claim 4, wherein the voltage of Vcon is about 2.8V to 3.3V in case of the high voltage mode of Vcon, and about 0V to 0.5V in case of the low voltage mode of Vcon.

* * * * *